Figure 1A:
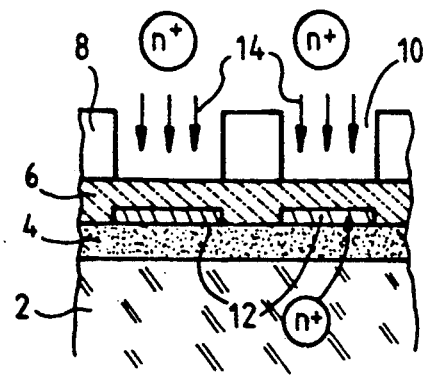

United States Patent [19]

Blanc et al.

[11] Patent Number: 5,130,770
[45] Date of Patent: Jul. 14, 1992

[54] INTEGRATED CIRCUIT IN SILICON ON INSULATOR TECHNOLOGY COMPRISING A FIELD EFFECT TRANSISTOR

[75] Inventors: Jean-Philippe Blanc, Gieres; Joëlle Bonaime, Echirolles; Jean du P. De Poncharra, Quaix-en-Chartreuse; Robert Truche, Gieres, all of France

[73] Assignee: Brevatome, Paris, France

[21] Appl. No.: 715,426

[22] Filed: Jun. 14, 1991

[30] Foreign Application Priority Data

Jun. 19, 1990 [FR] France .............................. 90 07655

[51] Int. Cl.$^5$ .................. H01L 27/01; H01L 27/12; H01L 27/04; H01L 29/06
[52] U.S. Cl. .................. 357/23.700; 357/4; 357/55; 357/50; 357/59; 357/38; 357/39
[58] Field of Search .............. 357/23.7, 38, 39, 4, 357/55, 50, 59 G, 59 E

[56] References Cited

U.S. PATENT DOCUMENTS 4,371,886  2/1983  Hartman et al. ................ 357/38

FOREIGN PATENT DOCUMENTS 0009910  4/1980  European Pat. Off. .
0219831  4/1987  European Pat. Off. .
0225821  6/1987  European Pat. Off. .
2070858  9/1981  United Kingdom .

*Primary Examiner*—William Mintel
*Assistant Examiner*—Wael Fahmy

[57] ABSTRACT

An integrated circuit in silicon on insulator technology comprises a JFET transistor with an insulated source and drain of one conductivity type in the upper part of a semiconductor island, an upper gate between the source and the drain, a buried insulating layer supporting the island, and a buried electrode in the island and in contact with the insulating layer. That electrode has a second conductivity type different from the first. A zone is diffused into at least one edge of the island from a conductive material covering the edge, that conductive material being doped with impurities of the second conductivity type. The diffused zone of the second conductivity type is electrically insulated from the source and drain and ensures the electrical contacting of the electrode and the conductive material constituting the electrical contact to the electrode and source. Drain and gate contacts are also provided which are electrically insulated from one another and from the electrode contact. A process for making the circuit is also disclosed.

7 Claims, 4 Drawing Sheets

INTEGRATED CIRCUIT IN SILICON ON INSULATOR TECHNOLOGY COMPRISING A FIELD EFFECT TRANSISTOR

DESCRIPTION

The invention relates to an integrated circuit in semiconductor on insulator technology comprising at least one junction field effect transistor (JFET) and/or an insulated gate field effect transistor (MIS), as well as its production process.

It is applicable to the field of integrated circuits having a high operating speed, a response to high voltages and optionally a considerable resistance to ionizing radiation and which must be able to dissipate high power levels.

Silicon on insulator or SOI technology constitutes a significant improvement in the field of microelectronics compared with production procedures for integrated circuits on a solid semiconductor substrate. Thus, the use of an insulating support greatly reduces parasitic capacitances between the source of the transistors and the substrate on the one hand and the drain of said transistors and the substrate on the other, so that the operating speed of the integrated circuits is increased.

One of the known methods for producing a n channel JFET transistor consists of implanting a n type zone on the surface of a highly doped, p/n-type silicon substrate, which will form the buried gate of the transistor, etching the silicon to form an island containing the n type zone and then thermally oxidizing the silicon island.

A polycrystalline silicon layer is then deposited, followed by the etching of the starting silicon to the foot of the island. The source, drain and gate zones are then formed on the rear face of the island by implanting p-type ions for the source and drain and n-type ions for the gate. The electrical contact on the buried gate is produced by the diffusion of n-type ions through the p-type substrate.

The production of a p-channel JFET on an insulator takes place in the same way and merely involves the reversing of the n and p regions and the type of doping impurities.

The electrical insulation between two JFET transistors of the same circuit is brought about by etching semiconductor islands and oxidizing the same.

Another known procedure for producing a n-channel JFET on an insulator consists of implanting oxygen ions in a monocrystalline silicon substrate and then annealing the assembly to form a monocrystalline silicon film supported by a SiO₂ layer. Then, using ion implantation, the buried gate of the transistor is formed in the semiconductor film, followed by the epitaxying of a thick silicon layer on the semiconductor film.

The gate, source and drain regions are formed on the surface of the epitaxied layer by ion implantation of ions respectively of the n-type for the gate and the p-type for the source and drain. Electrical contacting on the buried gate takes place by ion implantation in the same way as the collector well in a bipolar transistor, i.e. by carrying out different ion implantations at different depths and of the n+ type, followed by diffusion by heat treatment in order to obtain the contact with the buried gate.

The electrical insulation between two transistors of the same integrated circuit is then carried out by a local field oxide of the LOCOS type.

These JFET on insulator production methods are difficult to carry out and are complicated. In addition, their reliability level is below that of conventional procedures for producing a JFET on a solid semi-conductor.

Moreover, the first method differs significantly from the generally used technologies in microelectronics and the second uses an insulation between the different devices by a local field oxide, which has a poor behavior with respect to ionizing radiation.

One of the known methods for producing a n-type MIS transistor on an insulating support, known as SOS, consists of epitaxying a monocrystalline silicon layer on a sapphire substrate, etching said layer to form silicon islands, implanting n-type ions on the edges of these islands to form source and drain regions, thermally oxidizing said islands, etching the thus formed oxide layer to constitute the gate oxide, depositing an n+ doped polycrystalline silicon layer on the islands obtained and etching said layer to define source and drain contacts and the gate.

It is relatively easy to produce MIS transistors. However, this process suffers from the disadvantages of high production costs and limited efficiency. It is also difficult to electrically check the transistor beneath the channel.

Another production technology for a MIS on insulator transistor consists of implanting oxygen ions in a monocrystalline silicon substrate, followed by annealing in order to form a monocrystalline silicon film supported by a buried SiO₂ layer. The MIS transistor is then produced in this silicon film with the standard technology used on a solid semiconductor. These transistors are insulated by local oxidization of the LOCOS type.

However, this simple technology also fails to allow a good electrical check of the transistor beneath the channel. There is also a parasitic transistor on the border of the LOCOS. Moreover, this type of insulation between the transistor generally has an inadequate behavior with respect to ionizing radiation.

The invention therefore relates to an integrated circuit in semiconductor on insulator technology comprising a MIS or JFET-type transistor, as well as its production process, making it possible to obviate the disadvantages referred to hereinbefore.

In particular, this circuit has all the advantages of semiconductor on insulator and in particular silicon on insulator technology. Its production process is much simpler than that of the prior art, while still using conventional microelectronics technology. Moreover, it is possible to produce the buried gate of a JFET either solely beneath the transistor channel, or solely beneath the source and channel, or on the entire surface of the insulator, thus making it possible to adapt the circuit obtained to different applications and while giving a good voltage response.

More specifically, the invention relates to an integrated circuit comprising at least one field effect transistor having a source and a drain in the upper part of a semiconductor island, obtained by the local introduction of impurities of a first conductivity type, a gate located on the island between the source and the drain and electrically insulated therefrom, a buried electrical insulating layer supporting the island, an electrode buried in the island and in contact with the insulating layer, said electrode having a second conductivity, different from the first, a zone diffused into at least one edge of the island from a conductive material covering the said edge, said conductive material being doped with impurities of the second conductivity type, the diffused zone of the second conductivity type being electrically insulated from the source and drain and ensuring the electrical contacting of the electrode and the conductive material constituting the electrical contact of the electrode, while the source, drain and gate contacts are electrically insulated from one another and from the electrode contact.

Advantageously, the gate and electrical contact of the buried electrode are produced in the same appropriately etched, doped conductive layer.

Thus, the connection of the buried electrode by diffusion of impurities on the etched edges of the semiconductor island involves no additional technical stage. Thus, the stages of depositing and etching a conductive layer are necessary for the production of the upper gate.

The pinching of the channel of said transistor takes place perpendicular to the channel by polarization of the upper, buried gate.

The buried electrode has the advantage of masking the semiconductor-insulator interface, which is important under ionizing radiation, because it permits a good radiation response.

For a circuit having several transistors, the possibility of varying the shape of the buried electrodes makes it possible to ensure that the circuit has a good voltage response between the different buried electrodes, each buried electrode being able to have its own form or shape, different from that of the other buried electrodes.

The insulator layer can be of silicon nitride or silicon dioxide, advantageously obtained by one or more ion implantations respectively of nitrogen or oxygen in a monocrystalline silicon substrate and at high dose levels, but which do not make the silicon amorphous, followed by annealing ensuring, on the one hand, the healing of faults produced in the substrate and in particular in the monocrystalline silicon film formed on the insulator layer during implantation and, on the other hand, the continuity of the insulating layer.

For more detailed information on this method of producing a SOI structure, reference can be made to FR-A-2 616 590, filed on Jun. 15 1987 by the present Applicant.

However, it is also possible to obtain the SOI by the epitaxy of a monocrystalline silicon film on an insulator, such as sapphire, or by depositing an amorphous or polycrystalline silicon layer on an amorphous substrate, such as glass or silica, followed by the recrystallization of the silicon.

The use of a buried insulating layer makes it possible to electrically check the transistor beneath the channel. Advantageously, the semiconductor island is constituted by a monocrystalline film on which is epitaxied a thicker semiconductor layer, said film and said semiconductor layer being etched.

The buried electrode for JFET transistors constitutes a genuine buried gate, which is not the case for MIS transistors. In the case of the latter, the buried electrode which is in direct contact with the epitaxied semiconductor layer can be independently addressed for each transistor. It cannot be likened to a buried gate, because it is of the same conductivity type as the epitaxied layer, unlike in the case of JFET transistors. This electrode does not exist in conventional MIS transistors.

For an integrated circuit with two field effect transistors, the electrical insulation between these two transistors is provided by the space separating the two islands, the latter being obtained by etching the same semiconductor material over its entire thickness and not with the aid of a local oxidization of the LOCOS type, thus eliminating the problems associated with this type of insulation.

The invention also relates to a process for the production of this integrated circuit. In particular, this process involves at least one field effect transistor and comprises the following stages:

(a) formation of an electrical insulating layer buried in a semiconductor substrate, (b) doping the semiconductor material supported by the insulating layer with impurities of a first conductivity type in order to form a buried conductive layer in contact with the insulating layer, (c) etching the semiconductor material supported by the insulating layer until the latter is reached, in order to form a semiconductor island, (d) electrical insulation of the transistor source, drain and gate zones, (e) production of the source and drain in the upper part of the semiconductor island by the local introduction of impurities of a second conductivity type, which is different from the first type, (f) production of the gate and gate contact of the transistor on the island between the source and the drain, (g) formation of a conductive material doped by impurities of the first conductivity type on at least one edge of the semiconductor island, (h) heat treatment of the structure obtained in (g) in order to diffuse the impurities of the doped conductive material into the edge of the island and so as to form in this way an electrical contact on the buried conductive layer, which is insulated from the source and drain and which is ensured by the conductive material, and (i) production to electrical contacts of the source and drain of the transistor, which are electrically insulated from one another and from those of the electrode and gate.

The doping of the conductive material can advantageously be carried out following the deposition of the conductive material. However, it is possible to directly deposit the conductive material in doped form.

The inventive process has the advantage of using a conventional microelectronics technology and requiring no modification of presently used installations. Moreover, the different stages of this process are not critical and are compatible with complimentary MIS or JFET transistor production on the same substrate.

In this case, the n-type doping of the conductive material on the edges of islands intended for JFET or MIS transistors with a p-type drain and source results from a n-type doping of the entire structure by masking the islands intended for the n-type drain and source transistors and p-type doping of the conductive material on the edges of islands intended for the n-type source and drain transistors results from a p-type doping of the entire structure, while in this case, masking the islands intended for the p-type drain and source transistors. Such a complimentary doping, following the deposition of the material to be doped, is not possible with glass, the doping of the latter only being performable during its deposition.

Advantageously, a semiconductor layer is epitaxied onto the semiconductor film, the drain and source then being formed in the epitaxied layer and the buried conductive layer in the semiconductor film.

The semiconductor layer is formed by epitaxying at low temperature and over a limited thickness, i.e. at a temperature below the silicon melting temperature and over a thickness of 500 to 2000 nm.

Figure 3A:
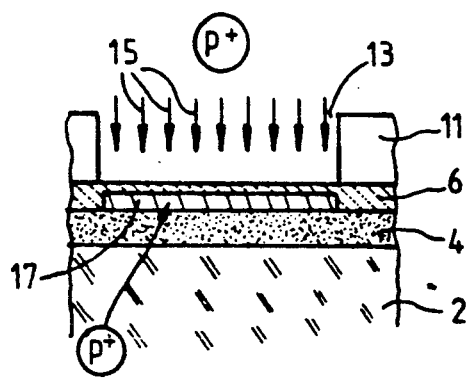
Figure 1B:
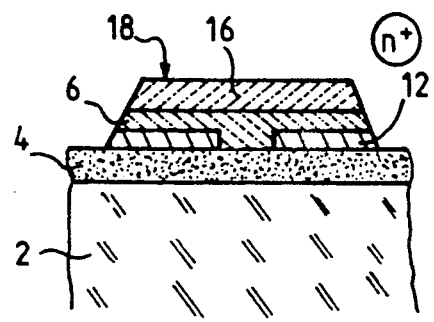
Figure 3B:
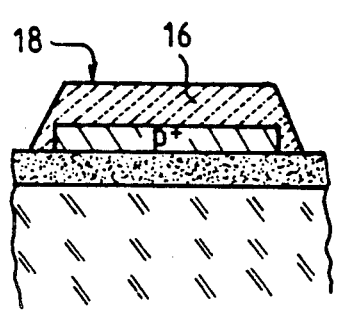
Figure 3C:
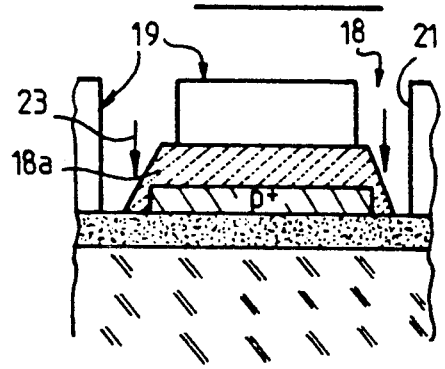
Figure 1C:
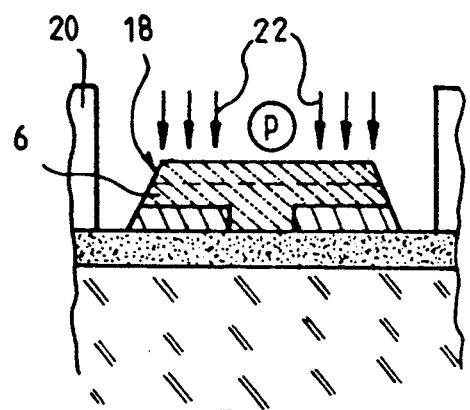
Figure 3D:
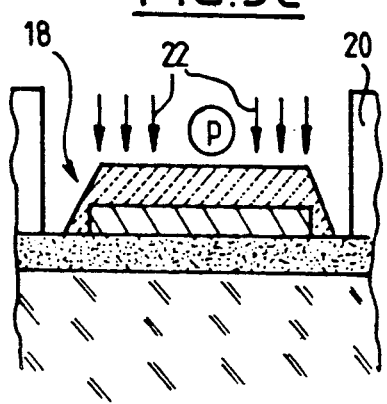
Figure 1D:
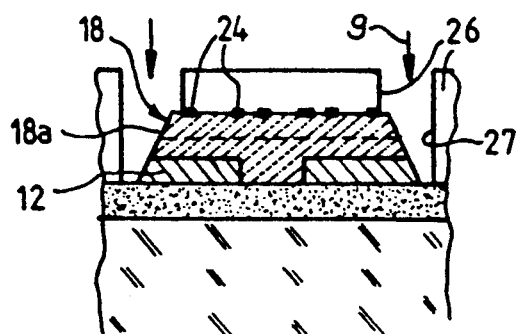
Figure 3E:
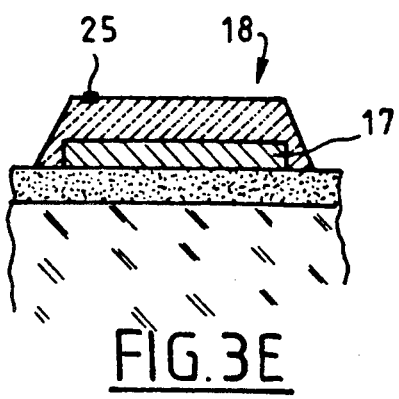
Figure 1E:
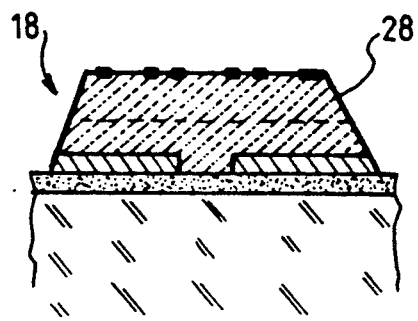
Figure 3F:
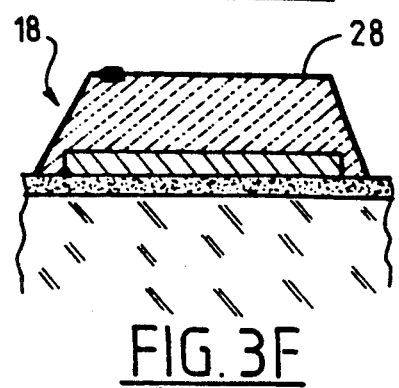
Figure 1F:
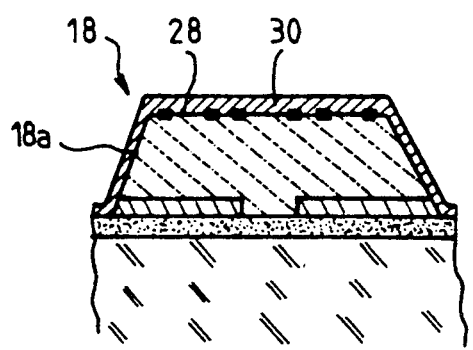
Figure 3G:
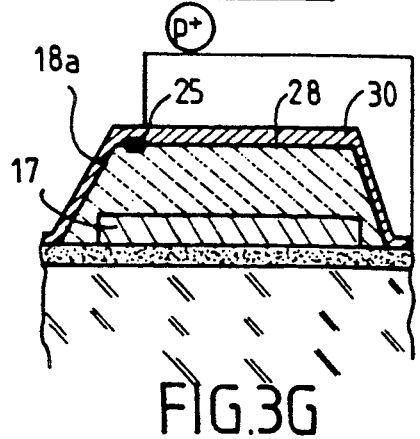
Figure 1G:
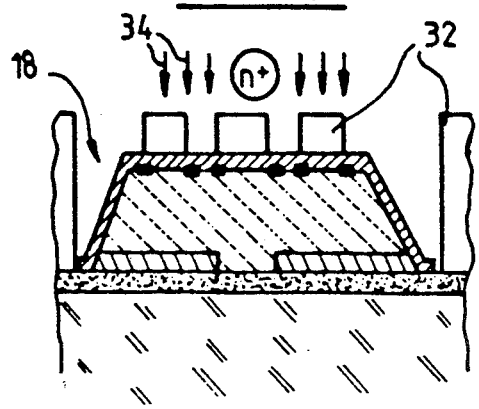
Figure 3H:
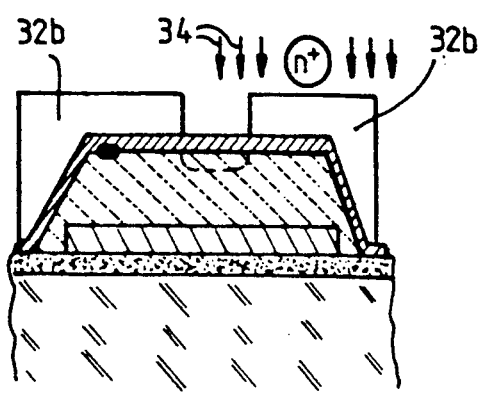
Figure 1H:
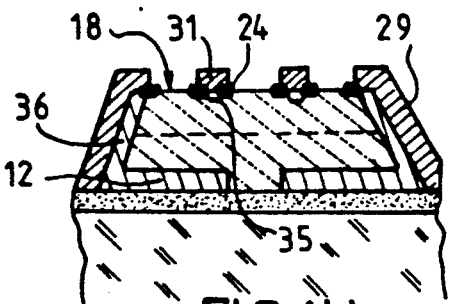
Figure 3I:
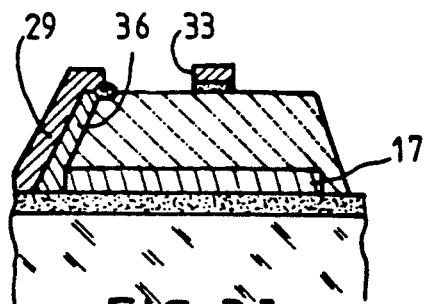
Figure 1I:
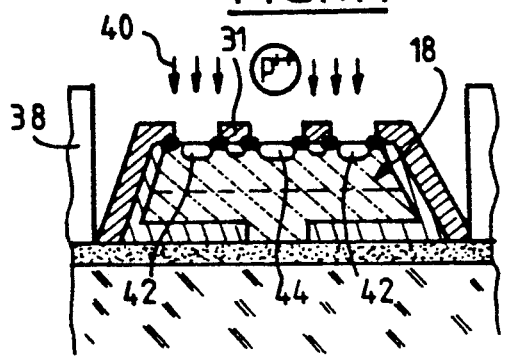
Figure 3J:
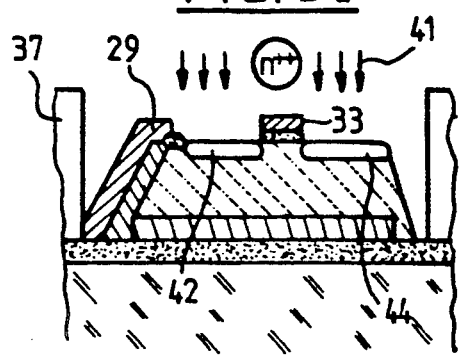
Figure 1J:
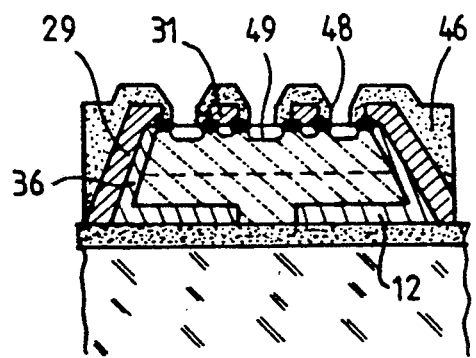
Figure 3K:
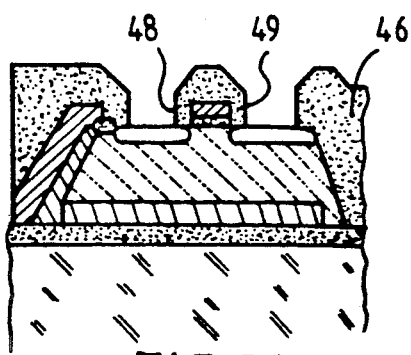
Figure 1K:
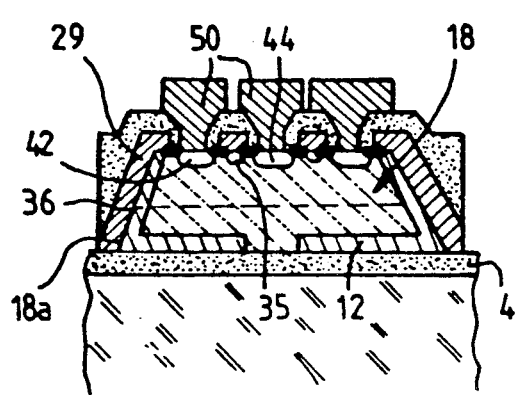
Figure 3L:
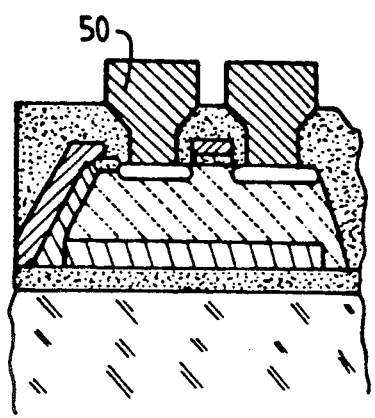
Figure 2:
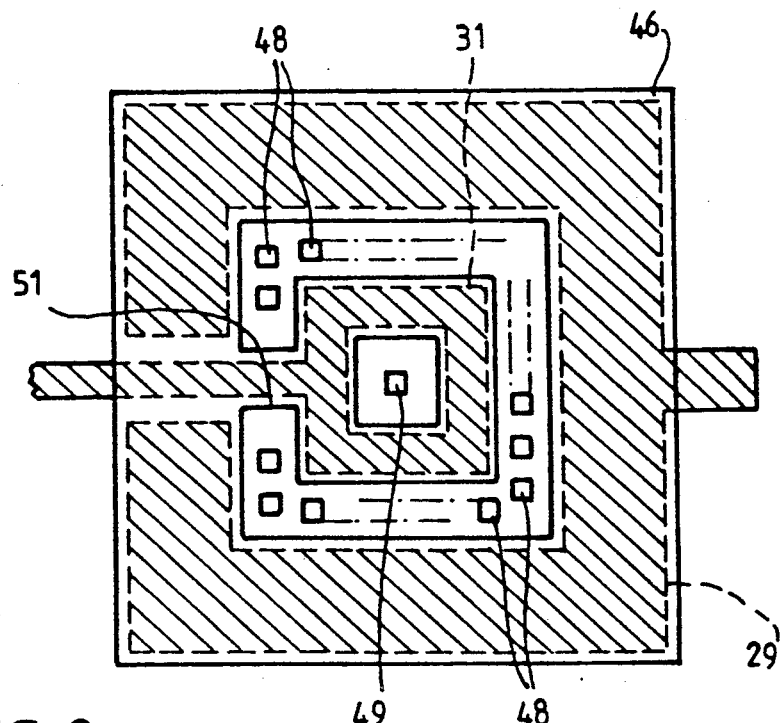
Figure 4:
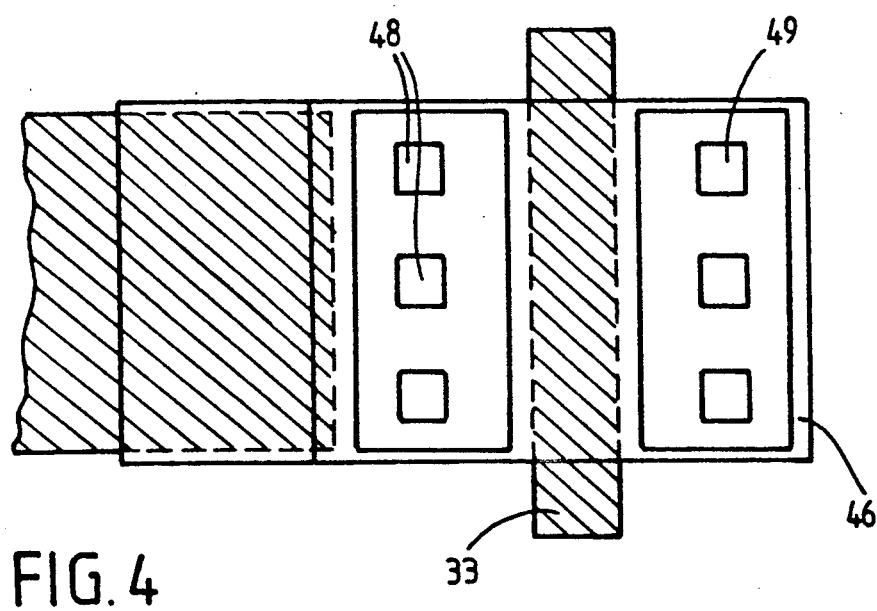

The invention is described in greater detail hereinafter relative to non-limitative embodiments and the attached drawings, wherein show:

FIGS. 1A to 1K & 2 Diagrammatically, the different stages of producing a JFET integrated circuit according to the invention, FIGS. 1A to 1K being longitudinal sections and FIG. 2 a plan view of FIG. 1J, FIGS. 3A to 3L & 4 Diagrammatically, the different stages of producing a MOS transistor integrated circuit according to the invention, FIGS. 3A to 3L being longitudinal sectional views and FIG. 4 a plan view of FIG. 3K, The following description relative to FIGS. 1A to 1K and 2 relates to the production of a p-channel JFET integrated circuit and, the description with reference to FIGS. 3A to 3L and 4 relates to the production of a n-channel MOS transistor integrated circuit. However, the invention has much wider applications and in particular applies to the production of integrated circuits with n-channel JFET transistors or p-channel MOS transistors, as well as to CJFET or CMOS circuits having both n-channel and p-channel transistors. For reasons of simplification, the drawings only show a single transistor.

With reference to FIG. 1A, the first production stage of a p-JFET integrated circuit consists of forming on a monocrystalline silicon substrate 2 an electrically insulating layer 4 at a depth of approximately 200 nanometers and over a thickness of 400 nm, supporting a 200 nm thick monocrystalline silicon film 6. This layer 4 is preferably of $SiO_2$.

This silicon on insulator structure can be obtained by oxygen ion implantation in substrate 2 at an energy of 100 to 400 keV and a dose of 1 to $2.10^{18}$ atm/cm$^2$, followed by annealing at 1350° C.

This is followed by the photolithographic production of a resin mask 8, whose openings 10 define the shape and sizes of the lower or buried gates of the transistors to be produced. With the mask shown in FIG. 1A, a buried, lower gate 12 is produced which, in section, has square internal and external shapes in the manner shown in FIG. 2, as well as a constant thickness.

This buried gate 12 is obtained by implanting n+ type ions in the film 6 and in particular phosphorus or arsenic ions at a dose of $10^{15}$ atm/cm$^2$ and an energy of 50 keV. This implantation symbolized by the arrows 14 can also take place through a thin protective layer, in particular of $SiO_2$ and having a thickness of 10 to 20 nm obtained by thermal oxidation of the silicon film 6.

Advantageously, after eliminating the mask 10, the structure can be annealed at approximately 1000° C. in order to ensure the diffusion of the implanted n+ ions to the insulating layer 4, so as to form n+ buried gates in contact with the insulator 4 in the film 6.

This is followed by the epitaxy on the silicon film 6 of a 1 μm thick monocrystalline silicon layer 16 e.g. at a temperature equal to or below 1000° C. With the aid of a not shown photolithographic mask, this is followed by the etching of the layer 16 and the film 6, e.g. using the wet process and a potash solution or a dry process (reactive or non-reactive or plasma etching) in order to form semiconductor islands 18, whose shape and sizes fix those of the transistors to be produced.

This etching is carried out selectively by stopping on the insulating layer 4. It also makes it possible to electrically separate the transistors from one another, which eliminates the insulation of the LOCOS type. The structure obtained is shown in FIG. 1B.

The following stage consists of producing a resin photolithographic mask 20, which masks all the structure of the integrated circuit, with the exception of the islands used for producing p-JFET transistors. With the aid of the mask 20, an ion implantation 22 takes place in the channel of the transistors. This implantation is carried out with p-type ions and in particular boron ions at a dose of $10^{12}$ atm/cm$^2$ and an energy of 150 keV, as shown in FIG. 1C.

After eliminating the mask 20 local lateral insulations are formed in the upper part of the semiconductor islands 18 and which serve to electrically insulate from one another the source, drain and gate of each transistor, while insulating the source and drain from the electrical contact zone of the buried gate 12. This local insulation 24 has a thickness of approximately 200 nm. It can be of the LOCOS type or can be obtained by depositing an insulator and then etching the latter. The structure obtained is shown in FIG. 1D with a LOCOS-type insulation.

This is optionally followed by a passivation of the etched edges 18a of the semiconductor islands 18. This passivation is obtained by doping the edges using a mask 26, which only has openings 27 facing the etched edges. This etching can be carried out by implanting boron ions at a dose of $10^{12}$ to $10^{13}$ atm/cm$^2$ and an energy of e.g. 50 keV. This doping of the edges 18a makes it possible to reduce the leakage currents of the transistors.

In the manner shown in FIG. 1E, this is followed by a thermal oxidation of the islands 18 to form an approximately 40 nm thick silicon dioxide layer 28. This oxide 28 is then selectively etched with respect to the silicon of the islands 18, so as to eliminate the insulator at the location of the gate junctions and the contacts of said junctions to be produced. The structure obtained is as shown in FIG. 1F. In particular, the insulator 28 is eliminated on the edges 18a and between the insulations 24, where the upper gate of each transistor will be formed. A buried gate corresponds to each upper gate and they face one another.

The $SiO_2$ layer 28 can be etched by the wet process and requires a not shown photolithographic mask.

This is followed by the deposition of an intrinsic polycrystalline silicon layer 30 on all the islands 18, having a thickness of e.g. 500 nm, said deposit being produced by low pressure chemical vapor deposition (LPCVD).

The following stage of the process, as shown in FIG. 1G, consists of forming a new resin lithographic mask 32 masking the entire integrated circuit, with the exception of the islands 18 intended for the production of the p-channel JFET transistors, together with the source and drain regions of these transistors.

Through the mask 12 takes place an ion implantation 34 with n+ type ions and in particular phosphorus or arsenic ions with an energy of 50 keV and a dose of $10^{15}$ atm/cm$^2$. This ion implantation ensures the n+ type doping of the polycrystalline layer 30 facing, on the one hand, the junction of each upper gate and the corresponding contact to be produced and on the other hand the contacting and corresponding contact of each buried gate 12.

Following the elimination of the implantation mask 32 and in the manner shown in FIG. 1H, an etching takes place of the locally doped semiconductor layer 30 takes place so as to eliminate said layer at the locations of the transistor source and drain corresponding to the undoped zones of the layer 30. This etching takes place by means of a not shown mask and can be carried out by reactive ionic etching using $SF_6$, the stopping of the etching being determined by the time. This is followed by the elimination by etching of the insulator 28 covering the source and drain zones, which have been exposed during the etching of the layer 30.

This etching stage permits the simultaneous production of the contact of the upper gate 31 of each transistor, as well as the electrical contact 29 of each buried gate. The contact 29 of each buried gate covers the edges 18a of the corresponding island. The contact 31 of the upper gate has, in section, square internal and external shapes and a constant thickness (cf. FIG. 2).

This is followed by a heat treatment of the structure at approximately 900° C., so as to ensure a local diffusion into the semiconductor island 18 of n+ ions implanted during the implantation 34. Thus, for each transistor the junction of the gate 35 is obtained perpendicular to the gate contact 31 and a diffused zone 36 on the edge of the island ensuring the electrical contact of the buried gate 12.

In the manner shown in FIG. 1I, this is followed by a new implantation mask 38 masking the integrated circuit, with the exception of the islands 18 used for producing the p-channel JFET transistors. Through the said mask 38, the contacts 29 and the upper gate 31, an implantation 40 takes place of ions of the p++ type and in particular boron ions at a dose of $10^{15}$ atm/cm$^2$ and an energy of 20 keV. This implantation leads to the formation of source 42 and drain 44 regions of the transistors. The drain is shaped like a square in plan view and is surrounded by the source 42, which has, in section, square internal and external shapes and a constant thickness.

Following the elimination of the implantation mask 38, thermal annealing takes place at 900° C. in order to heal the defects which have occurred during the implantation and so as to activate the implanted ions. This is followed by the deposition on the complete structure of an electrical insulator 46 and in particular silicon dioxide with a thickness of 500 nm. The insulator is then etched to form contact holes 48 and 49 for the source and drain regions respectively. The structure obtained is shown in FIGS. 1J and 2.

The final stage of the process, as shown in FIG. 1K, consists of depositing on the complete structure a metallization layer and then etching the latter to form contacts 50 on the source and drain zones. This metallization is in particular of 1 μm thick aluminium.

The following description relates to the production of a n-MOS transistor integrated circuit with reference to FIGS. 3A-3L. The elements of this circuit which are identical to those described hereinbefore carry the same references.

Following the formation of the buried insulator layer 4 and the polycrystalline silicon film 6 on the silicon substrate 2, in the manner shown in FIG. 3A, a resin photolithographic mask 11 is formed for the purpose of masking all the regions of the integrated circuit, with the exception of those intended for the production of n-channel transistors. This mask has in particular an opening 13 facing the region in which it is wished to produce the n-MOS transistor.

With the aid of the mask 11, a p-type ion implantation 15 takes place in the film 6 and this is in particular of boron at an energy of approximately 50 keV and a dose of $10^{15}$ atm/cm$^2$. Optionally following thermal annealing at 1000° C., this leads to a p+ type buried electrode 17 in the film 6, which has a thickness identical to or greater than that of the buried gate 12 of the p-JFET transistor. This electrode is shaped like a rectangular parallelepiped, as in the prior art, and is in contact with the insulating layer 14. This implantation can also take place through a protective layer, as described hereinbefore relative to FIG. 1A.

The silicon layer 16 is then epitaxied on the silicon film 6 under the same conditions as described hereinbefore.

As shown in FIG. 3B, the buried electrode 17 can be in direct contact with the epitaxied layer 16, unlike the buried gate 12 of the p-JFET transistors shown in FIG. 1B.

The stack of silicon layers 6 and 16 is then etched to form the semiconductor island 18, in the manner described hereinbefore.

As shown in FIG. 3C, a resin photolithographic mask 19 is formed, which only has openings 21 facing the etched edges 18a of the islands 18 used for the production of n-MOS transistors. This is followed by a doping of the edges 18a in order to reduce the leakage currents of the n-MOS transistors. This doping is carried out by implantation 23 of p-type ions, such as boron ions, at a dose of $10^{12}$ atm/cm$^2$ and an energy of 50 keV, followed by the elimination of mask 19.

In the manner shown in FIG. 3D, the implantation mask 20 is then formed and an implantation 22 of p-type ions takes place in the manner described relative to FIG. 1C. This implantation in a MOS transistor serves to adjust the threshold voltage beneath the transistor channel.

As shown in FIG. 3E, an insulation 25 then takes place on the surface of the semiconductor island 18 by depositing and etching or by local oxidation of the LOCOS type with a view to insulating the drain and source zones of the transistors from the electrical contact zone of the buried electrode 17. This insulator 25 is approximately 200 nm thick.

As shown in FIG. 3F, this is followed by an oxidation 28 of the islands 18 used for producing the gate oxide of the n-MOS transistor.

This is followed by an etching of the insulator 28, so as to eliminate the latter at the point where the contact of the buried electrode of each n-MOS transistor has to be carried out and in particular on the island edge 18a, to the left of FIG. 3G and adjacent to the insulation 25.

This stage requires a not shown mask and amounts to adding one stage to the conventional technical stages of producing n-MOS transistors. The polycrystalline silicon layer 30 is then deposited on all the islands 18.

A resin photolithographic mask 32a is then formed and masks the entire integrated circuit, with the exception of the edges 18a of the islands 18, on which will subsequently be formed the electrical contact of the buried electrode 17.

Through the said mask takes place an implantation 39 of p+ type ions and, in particular, boron ions at an energy of 20 keV and a dose of $10^{16}$ atm/cm$^2$. This implantation ensures a p+ doping of the polycrystalline silicon layer 30 facing the contacting and contact of each buried electrode 17 to be produced.

This is followed by the formation of a photolithographic mask 32b for the doping of the layer 30 perpendicular to the upper gate of the n-MOS transistor to be produced. This mask only has openings facing the upper gates of the n-MOS transistors to be produced. This doping is carried out by the implantation 34 of n+ type ions, as described relative to FIG. 1G.

In the manner shown in FIG. 3I, this is followed by the etching of the silicon layer 30, so as to simultaneously produce the upper gate 33 of the n-MOS transistor and then the electrical contact 29 of the buried electrode 17 of the transistor. Only the doped zones of the layer 30 are retained. This etching is carried out in the manner described hereinbefore.

This is followed by the heat treatment at 900° C. for the purpose of diffusing n+ type ions, implanted during the implantation 34 in the layer 30, into the etched edge 18a of each island covered with the electrical contact 29 of the buried electrode 17 corresponding thereto. The diffused zone in the island carries the reference 36.

As shown in FIG. 3J, a resin photolithographic mask 37 is then formed for masking all the integrated circuit zones, with the exception of the islands for producing the n-channel transistors. With the aid of the mask 37, the electrical connection 29 and the transistor gate 33 serving as an implantation mask, an implantation 41 takes place of n++ type ions for forming the transistor source 42 and drain 44. This implantation 41 consists of, in particular, implanting arsenic or phosphorus ions at a dose of $3.10^{15}$ atm/cm$^2$ and an energy of 50 keV. After eliminating the mask 41, post-implantation thermal annealing takes place giving the structure of FIG. 3J.

This is followed by the deposition of the insulating layer 46, in which are formed openings such as 48 and 49 respectively used for the contacting on the source, drain, upper gate and buried electrode of the n-MOS transistor. The structure obtained is shown in FIGS. 3K and 4.

The deposition of said layer 46 and its etching are carried out under the same conditions as described relative to FIG. 1J.

This is followed by the deposition of a metal layer on the complete structure, which is etched in order to form the source and drain contacts 50, as described relative to FIG. 1K. The final structure of the n-MOS transistor is as shown in FIG. 3L.

The description has related to a silicon on insulator technology, but it also applies to all semiconductor on insulator methods and in particular GaAs on silicon methods.

We claim:

1. An integrated circuit comprising at least one field effect transistor having a source (42) and a drain (44) in the upper part (16) of a semiconductor island (18), obtained by the local introduction of impurities of a first conductivity type, a gate (35, 33) located on the island between the source and the drain and electrically insulated therefrom, a buried electrical insulating layer (4) supporting the island, an electrode (12, 17) buried in the island and in contact with the insulating layer, said electrode having a second conductivity, different from the first, a zone (36) diffused into at least one edge (18a) of the island from a conductive material (29) covering the said edge, said conductive material being doped with impurities of the second conductivity type, the diffused zone of the second conductivity type being electrically insulated from the source and drain and ensuring the electrical contacting of the electrode and the conductive material which constitutes the electrical contact of the electrode, while the source, drain (50) and gate (31) contacts are electrically insulated from one another and from the electrode contact.

2. The integrated circuit according to claim 1, characterized in that the gate (31, 33) and the electrical contact (29) of the buried electrode are produced in the same appropriately etched, doped conductive layer.

3. The integrated circuit according to claims 1 or 2, characterized in that the conductive material is doped polycrystalline silicon.

4. The integrated circuit according to claim 1, characterized in that the island (18) is of monocrystalline silicon and the insulating layer (4) is one of silicon nitride and dioxide.

5. The integrated circuit according to claim 1, characterized in that the semiconductor island is constituted by a monocrystalline film (6) on which has been epitaxied a thicker semiconductor layer (16), said film and said semiconductor layer being etched.

6. The integrated circuit according to claim 1 comprising at least two electrically insulated field effect transistors, characterized in that each transistor has a semiconductor island over its entire thickness, the electrical insulation being ensured by the distance separating the edges (18a) of the two islands.

7. The integrated circuit according to claim 1, characterized in that the transistor is one of a junction transistor (JFET) and an insulated gate transistor (MIS).

* * * * *